United States Patent [19]
Gaynes et al.

[11] Patent Number: 5,910,641
[45] Date of Patent: Jun. 8, 1999

[54] SELECTIVELY FILLED ADHESIVES FOR COMPLIANT, REWORKABLE, AND SOLDER-FREE FLIP CHIP INTERCONNECTION AND ENCAPSULATION

[75] Inventors: Michael A. Gaynes, Vestal, N.Y.; Jaynal A. Molla, Chandler, Ariz.

[73] Assignee: International Business Machines Corporation, Armonk, N.Y.

[21] Appl. No.: 08/895,537

[22] Filed: Jul. 17, 1997

Related U.S. Application Data

[62] Division of application No. 08/781,397, Jan. 10, 1997.

[51] Int. Cl.$^6$ ........................................... H01L 23/02
[52] U.S. Cl. ................................ 174/52.4; 174/259
[58] Field of Search .................................... 257/782, 783, 257/789, 795, 726, 727, 718, 719; 361/760, 769, 825; 174/257, 52.4, 260, 259

[56] References Cited

U.S. PATENT DOCUMENTS

| 5,019,944 | 5/1991 | Ishii et al. ............................... 361/783 |
| 5,484,648 | 1/1996 | Odashima et al. ....................... 428/209 |

OTHER PUBLICATIONS

IBM Technical Disclosure Bulletin, vol. 38, No. 8, Aug. 1995.

*Primary Examiner*—Kristine Kincaid
*Assistant Examiner*—William Silverio
*Attorney, Agent, or Firm*—Hugh D. Jaeger

[57] ABSTRACT

An electrically conductive adhesive film having a pattern of microscopic elongate metal particles which extend from one surface to the other to provide an interconnection between confronting conductive metal pads abutting the surface. The particles have sharp ends to penetrate the oxide coating on the conductive metal pads of an electronic module when force is applied to press the module against the film.

9 Claims, 13 Drawing Sheets

```
┌─────────────────────────────────────────────────────────────┐
│ PRODUCING A PHOTOLITHOGRAPHIC PATTERN OF THE                │
│ CONDUCTIVE PADS ON A SACRIFICIAL SUBSTRATE OF NICKEL        │
│ SUPPORTED ON A TEMPORARY BACKING MEMBER.                    │
└─────────────────────────────────────────────────────────────┘
                              │
┌─────────────────────────────────────────────────────────────┐
│ GROWING DENDRITIC PALLADIUM MATERIAL FROM SAID              │
│ CONDUCTIVE NICKEL PADS.                                     │
└─────────────────────────────────────────────────────────────┘
                              │
┌─────────────────────────────────────────────────────────────┐
│ REMOVING SAID PHOTORESIST TO LEAVE SAID DENDRITIC           │
│ MATERIAL ON SAID PADS.                                      │
└─────────────────────────────────────────────────────────────┘
                              │
┌─────────────────────────────────────────────────────────────┐
│ COATING THE SURFACE CONTAINING SAID DENDRITIC MATERIAL      │
│ WITH AN ADHESIVE PLASTIC FILM WHICH LEAVES THE DENTRITE     │
│ ENDS EXPOSED.                                               │
└─────────────────────────────────────────────────────────────┘
                              │
┌─────────────────────────────────────────────────────────────┐
│ STRIPPING THE SACRIFICIAL NICKEL SUBSTRATE AND TEMPORARY    │
│ BACKING MEMBER FROM SAID ADHESIVE                           │
│ PLASTIC FILM.                                               │
└─────────────────────────────────────────────────────────────┘
                              │
┌─────────────────────────────────────────────────────────────┐
│ POSITIONING SAID ADHESIVE FILM BETWEEN A CIRCUIT BOARD      │
│ AND ELECTRONIC MODULES WITH THE DENDRITIC AREAS IN          │
│ ALIGNMENT WITH PADS TO BE INTERCONNECTED.                   │
└─────────────────────────────────────────────────────────────┘
                              │
┌─────────────────────────────────────────────────────────────┐
│ APPLYING PRESSURE TO SAID MODULES AND THE CIRCUIT BOARD     │
│ TO FORCE THE DENDRITIC ENDS INTO ELECTRICAL CONTACT WITH    │
│ THE CORRESPONDING PADS ON THE MODULES AND CIRCUIT           │
│ BOARD.                                                      │
└─────────────────────────────────────────────────────────────┘
                              │
┌─────────────────────────────────────────────────────────────┐
│ MAINTAINING THE PRESSURE ON SAID MODULE AND CIRCUIT         │
│ BOARD TO SUSTAIN THE ELECTRICAL CONTACT.                    │
└─────────────────────────────────────────────────────────────┘
```

FIG. 10

SELECTIVELY FILLED ADHESIVES FOR COMPLIANT, REWORKABLE, AND SOLDER-FREE FLIP CHIP INTERCONNECTION AND ENCAPSULATION

CROSS REFERENCES TO CO PENDING APPLICATIONS

This patent application is a division of patent application U.S. Ser. No. 08/781,397 entitled "Selectively Filled Adhesives for Complaint, Reworkable, and Solder-Free Flip Chip Interconnection and Encapsulation" filed on Jan. 10, 1997.

BACKGROUND OF THE INVENTION

1. Field of the Invention

This invention relates to a system for connecting the conductive pads on electronic circuit modules to corresponding pads on a printed circuit board.

2. Description of the Prior Art

A wide variety of techniques have been used to facilitate the interconnection between semiconductor modules and a substrate containing the interconnection wiring. As the semiconductor modules have become smaller and use correspondingly more power, the interconnection problem has become more difficult and the more conventional solder techniques become impractical.

One approach to the problem utilizes a dielectric film uniformly loaded with round conductive particles. The particle size is selected so as to make the electrical connection between particles statistically unlikely over a distance greater then the thickness of the film while maintaining a low resistance path normal to the film between the film surfaces. This approach has the inherent disadvantage of requiring adjacent pads on the same surface to be separated by a distance dictated by the statistical probability of an interconnection. As the pad-to-pad distance is decreased, the density of the particle loading must also be decreased to prevent unwanted pad-to-pad interconnection and this also decreases the quality of the through film pad-to-pad interconnection.

SUMMARY OF THE INVENTION

The general purpose of the present invention is a selectively filled adhesives for compliant, reworkable, and solder-free flip chip interconnection and encapsulation.

To accommodate the interconnection requirements of high density electronic modules it would be desirable to have a system which does not impose a restriction on the pad-to-pad spacing on the modules. Another desirable feature would be the easy removal of a previously mounted module and the substitution of another without damage to the substrate. Another desirable characteristic of the interconnection system would be the use of a freestanding film which eliminates the need for dispensing technology and be more likely to be usable in a field environment when a module must be removed and replaced.

The present invention utilizes a dielectric adhesive film which is fabricated by plating a personalized pattern of a sacrificial metal carrier with highly branched metal filaments having a length approximating the final thickness of the adhesive film. The pattern is preferably fabricated utilizing photolithographic techniques on a sacrificial metal carrier. After plating, the photoresist is removed and a dielectric adhesive is applied, creating a film of uniform thickness. The sacrificial metal carrier is then removed with a preferential etchant.

The finished adhesive film is then positioned and aligned between the pad surfaces on a substrate and the electronic modules. The electrical connection of the module pad surfaces and the substrate pads is preferentially accomplished by the application of pressure and/or heat to the module, which causes the sharp dendritic ends of the plated metal filaments to pierce the oxide or other coating on the pads.

It is therefore an object of the present invention to provide an adhesive film carrier of dendritic metal filaments arranged in a pattern corresponding to the substrate and module pads.

One object of the present invention is to provide an adhesive film carrier having dendritic metal filaments extending from one surface to the other in the regions of the abutting conductive pads.

Still another object of the present invention is to provide an adhesive film carrier for the interconnection of conductive pads on an electronic module which allows a mounted electronic module to be removed by the application of heat below 200 degrees Fahrenheit.

Still other objects, features and advantages of the present invention will become apparent from an understanding of the following description and drawings.

Having thus described embodiments of the present invention, it is the principal object of the present invention to provide a selectively filled adhesive dielectric film for compliant, reworkable, and solder-free flip chip interconnection and encapsulation.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
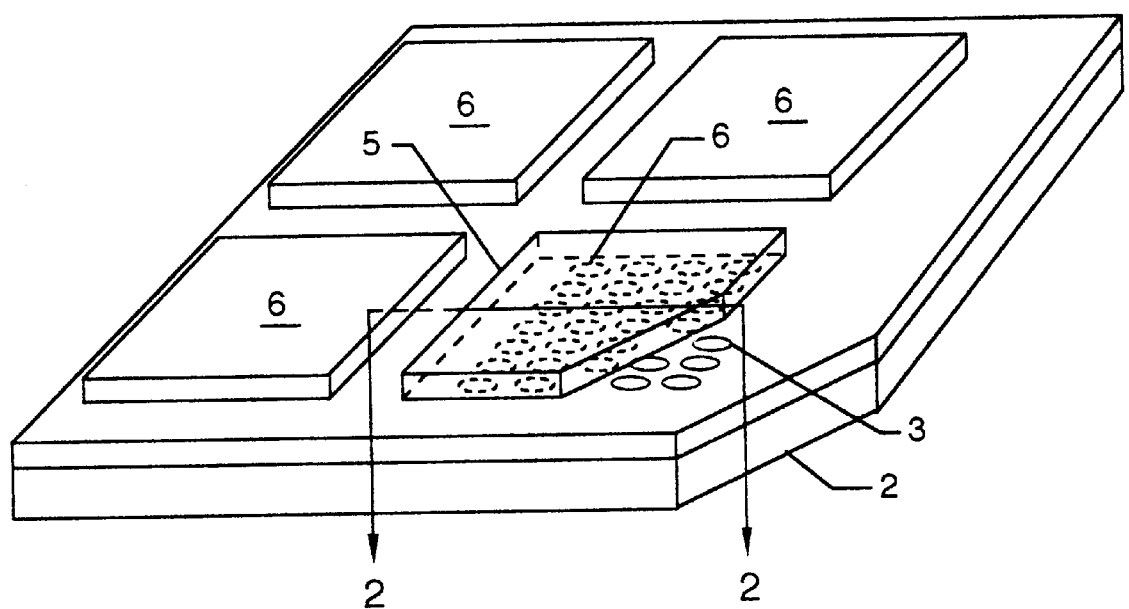
FIG. 1 illustrates a partial isometric view of an electronic system utilizing the method of the present invention.

With reference to FIG. 1, a printed circuit board 2, having a pattern of conductive metal pads 3 connected to internal wiring, not shown, in circuit board 2, carries an electronic module 5, having a plurality of complementary metal pads 6 which are connected to pads 3 through dendritic metal particles carried in an adhesive plastic film and arranged in a pattern corresponding to the metal pads 3 and 6.

Figure 2A:
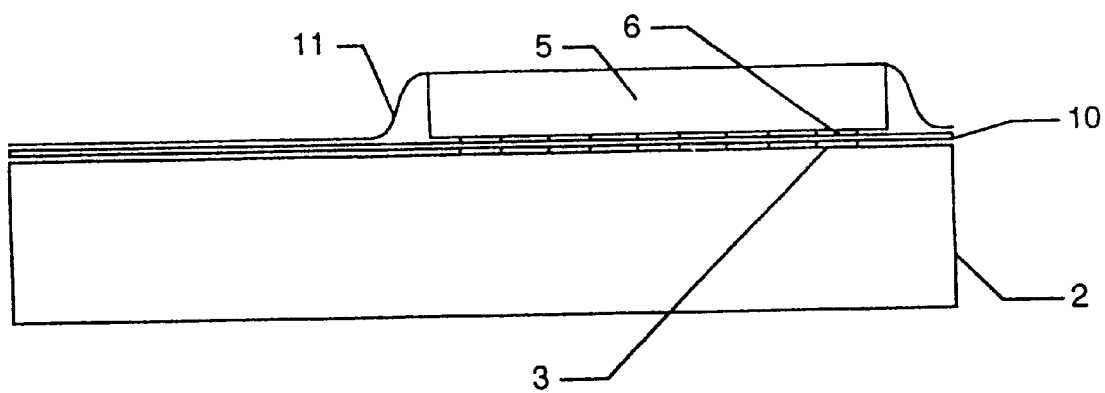
FIG. 2A illustrates an enlarged partial sectional view taken along the line 2—2 of FIG. 1 showing one means for applying pressure to the electronic module to make connections between corresponding pads.

FIG. 2A is a partial sectional view taken along the line 2—2 of FIG. 1 showing the printed circuit board 2 having conductive metal pads 3 which connected to the complementary conductive metal pads 6 on electronic module 5 by means of dendritic metal particles carried in adhesive dielectric film 10 to provide a surface to surface resistivity in the range of less than 40 milliohms/square micrometer arranged in a pattern corresponding to the pattern of pads 3 on the circuit board 2 and pads 6 on electronic module 5. The adhesive dielectric film is of a thickness in the range of 1–2 mils and can be selected from a family of adhesives such as epoxy; acrylic; silicone; thermoplastic including polyimide, polyetherimide and polysulfone; thermoset including cyanate ester; and a mixture of thermoplastic and thermoset.

In the embodiment shown in FIG. 2A, pressure is applied to electronic module 5 by means of a plastic shrink film 11, which causes the sharp ends of the dendritic metal particles to penetrate the pads 3 and 6, thereby establishing a good electrical connection therebetween.

Figure 2B:
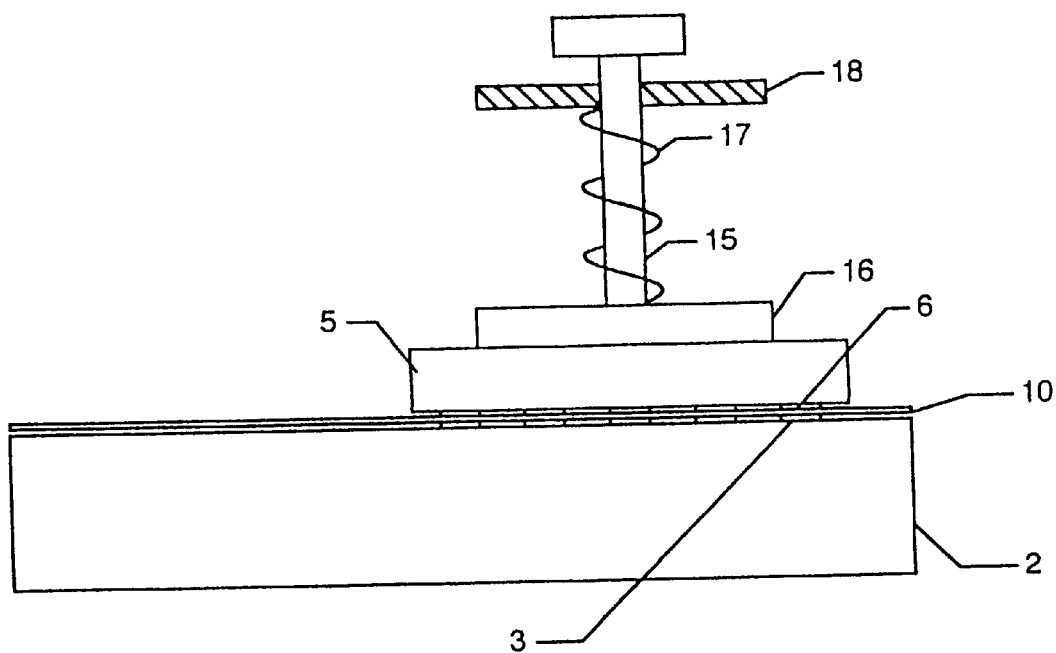
FIG. 2B is an enlarged partial sectional view taken along the line 2—2 of FIG. 1 showing alternative means for applying pressure to the electronic module to make connections between corresponding pads.

Alternatively, the embodiment shown in FIG. 2B utilizes a plunger 15 having a pressure pad 16 which engages the upper surface of module 5 and applies pressure created by spring means 17 which bears against the base member 18 affixed to the support for circuit board 2 by means not shown. spring means 17 has sufficient force to cause the ends of dendritic metal particles carried by adhesive film 10 to penetrate conductive metal pads 3 and 5, thereby establishing a good electrical connection therebetween.

Figure 3A:
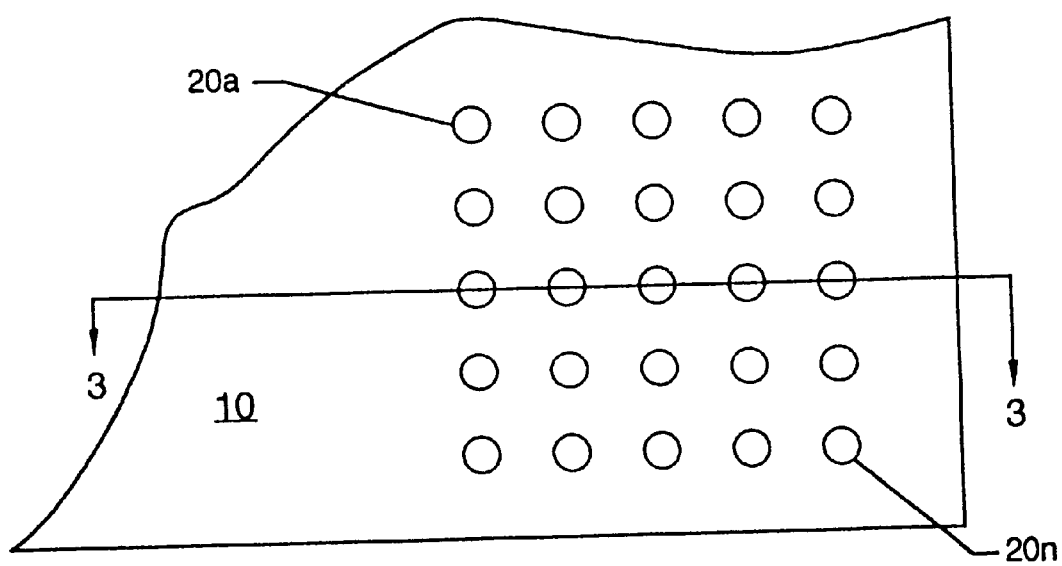
FIG. 3A is a partial top view and FIG. 3B is a side view taken along the line 3—3 of FIG. 3A, respectively, illustrating the sacrificial metal substrate having a photolithographic pattern for the interconnection pads.

FIG. 3A is a view of a portion of a sacrificial metal substrate used in the fabrication of the adhesive plastic film 10. The metal substrate has a photoresist in which a pattern of holes 20a–20n, corresponding to the pattern of pads 3 and 6 between which connection is desired, has been made by photolithographic techniques.

Figure 3B:
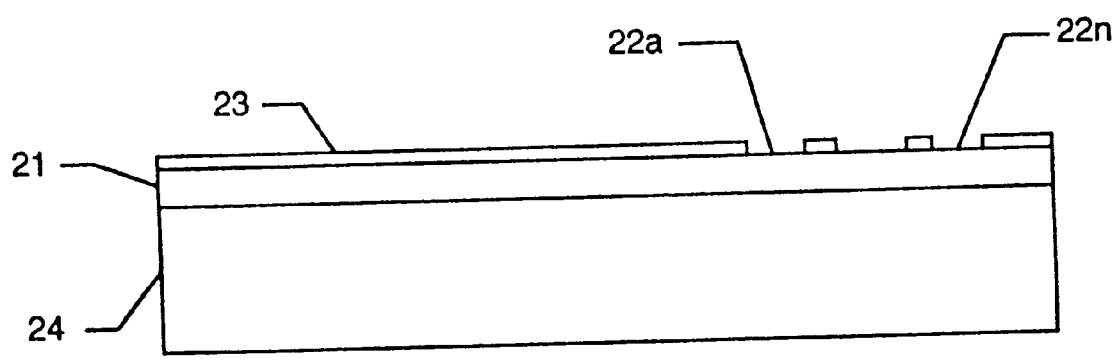

The partial sectional view of FIG. 3B, taken along the line 3—3 of FIG. 3A, shows the sacrificial metal substrate 21, which may be mounted on a temporary backing member 24, and the holes 22a–22n extending through the photoresist 23.

Figure 4A:
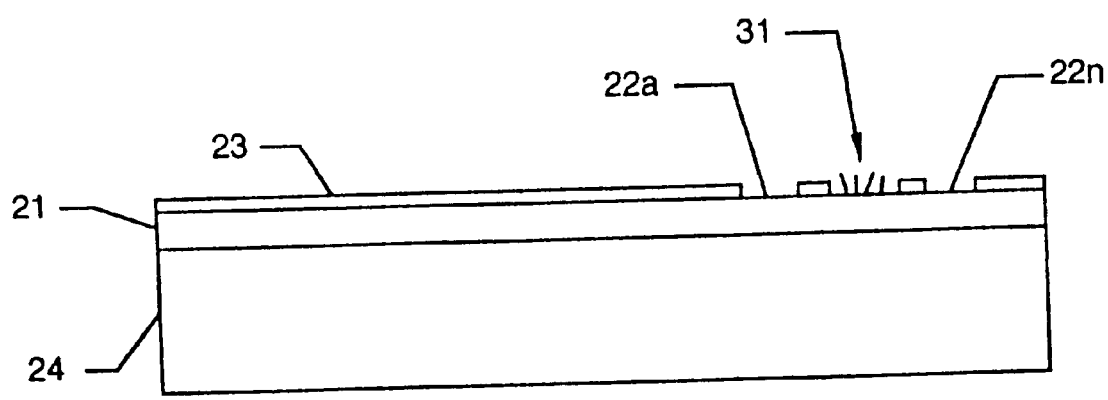
FIG. 4A is a partial sectional view taken along the line 3—3 of FIG. 3A showing the metal substrate after selective plating of dendritic metal particles with the photolithographic pattern of photoresist still in place.
Figure 4B:
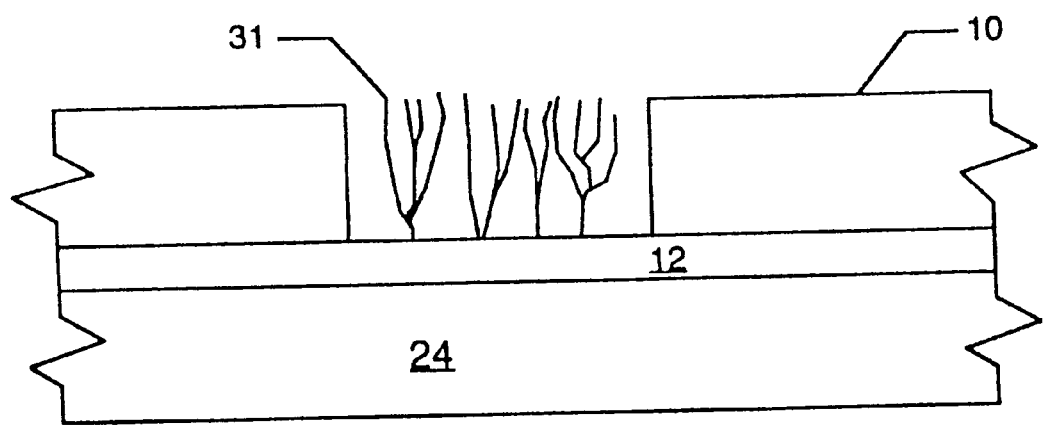
FIG. 4B is an enlarged portion of FIG. 4A showing the structure of the dendritic particles with the photolithographic pattern of photoresist still in place.

The intermediate assembly of FIGS. 3A and 3B is placed in a plating solution and dendritic metal particles are grown on the portions of metal substrate 21 exposed by holes 22a–22n, as shown in FIGS. 4A and 4B, utilizing conventional dendrite growing techniques. Information on growing dendrites suitable for use in this invention is provided in the publication:

Title: "A Novel Electrodeposition Process Which Enhances Connector Performance"

Authors: J. A. Molla
G. J. Saxenmeyer
A. D. Knight

Dated: 1993

Pages: Volume 93–20', pages 204–12

Name of Publication: Proceedings of the 2nd International Symposium on Electrochemical Technology Applications in Electronics, Electrochemical Society The preferred material for the dendrites is palladium. As shown in FIG. 4A, and more specifically in FIG. 4B, the dendritic metal particles 31 are grown to a length approximately the thickness of the adhesive plastic film 10.

Figure 5:
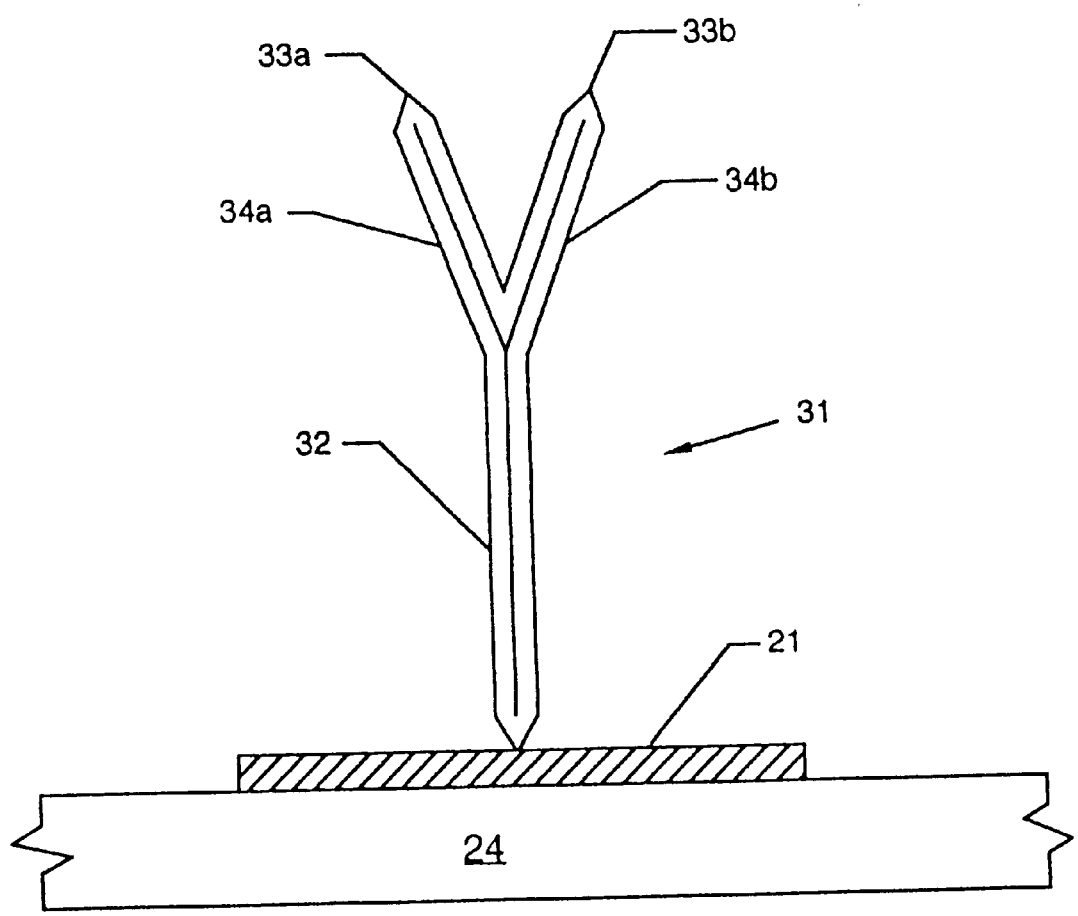
FIG. 5 is a partial microscopic view of the dendritic metal particles shown in FIG. 4B.

FIG. 5 is a microscopic side view of a typical dendritic metal particle 31. The structure is an upwardly branching configuration having a base member 32 emanating from the exposed pad areas of sacrificial metal substrate 21. The dendrites have a crystalline cross sectional shape and the ends 33a and 33b of branches 34a and 34b are typically sharply pointed. Similarly, the start of the dendrite is also pointed. The intermediate product represented in FIG. 5 includes the temporary backing member 24, the sacrificial metal substrate 21 and the dendritic metal particle 31.

Figure 6:
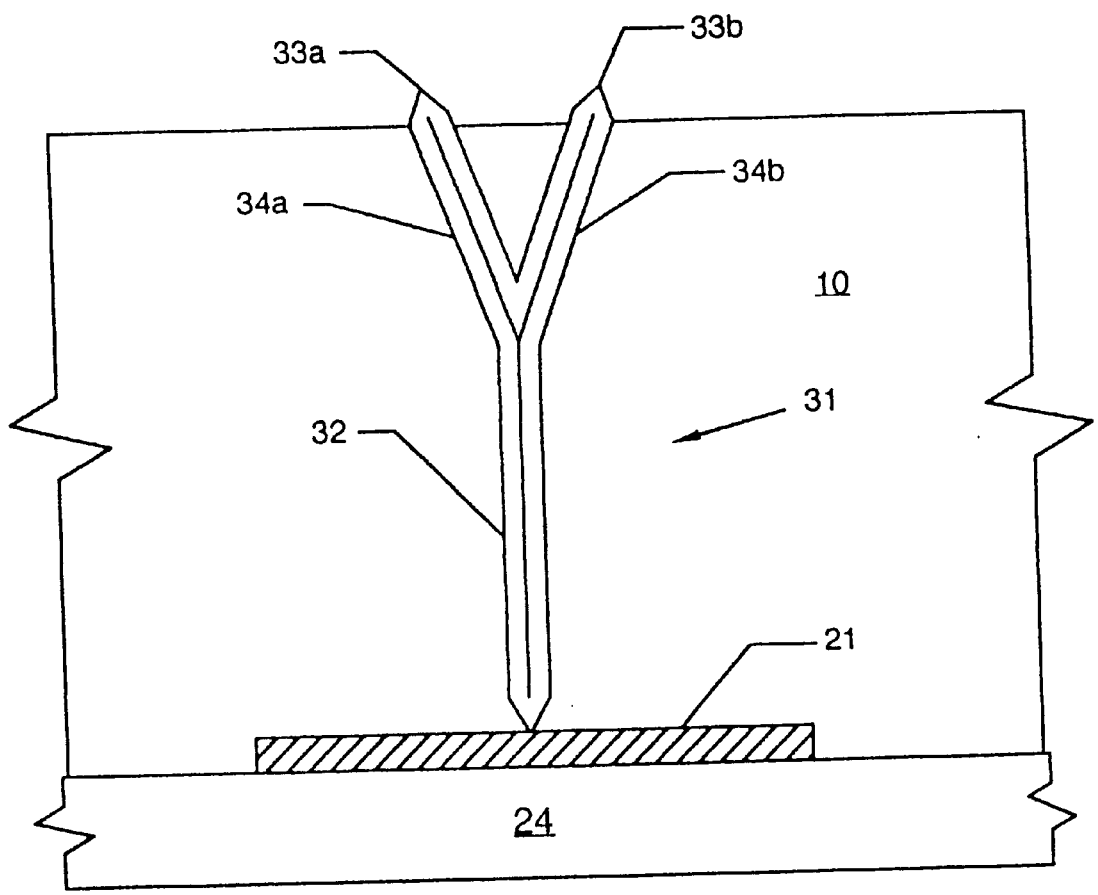
FIG. 6 is a partial sectional view of the dendritic metal particles taken along the line 3—3 of FIG. 3A showing the system after the photoresist has been stripped and the layer of adhesive Material applied.

FIG. 6 illustrates the adhesive plastic film 10 which is applied to the intermediate product of FIG. 5, where all numerals correspond to those elements previously described. The film has a nominal thickness which is preferably, but not necessarily slightly, less than the nominal height of dendritic metal particles 31, allowing the ends 33a and 33b to project above the upper surface of adhesive plastic film 10. Preferably, adhesive plastic film is applied in liquid form and cured in place by appropriate means.

Figure 7:
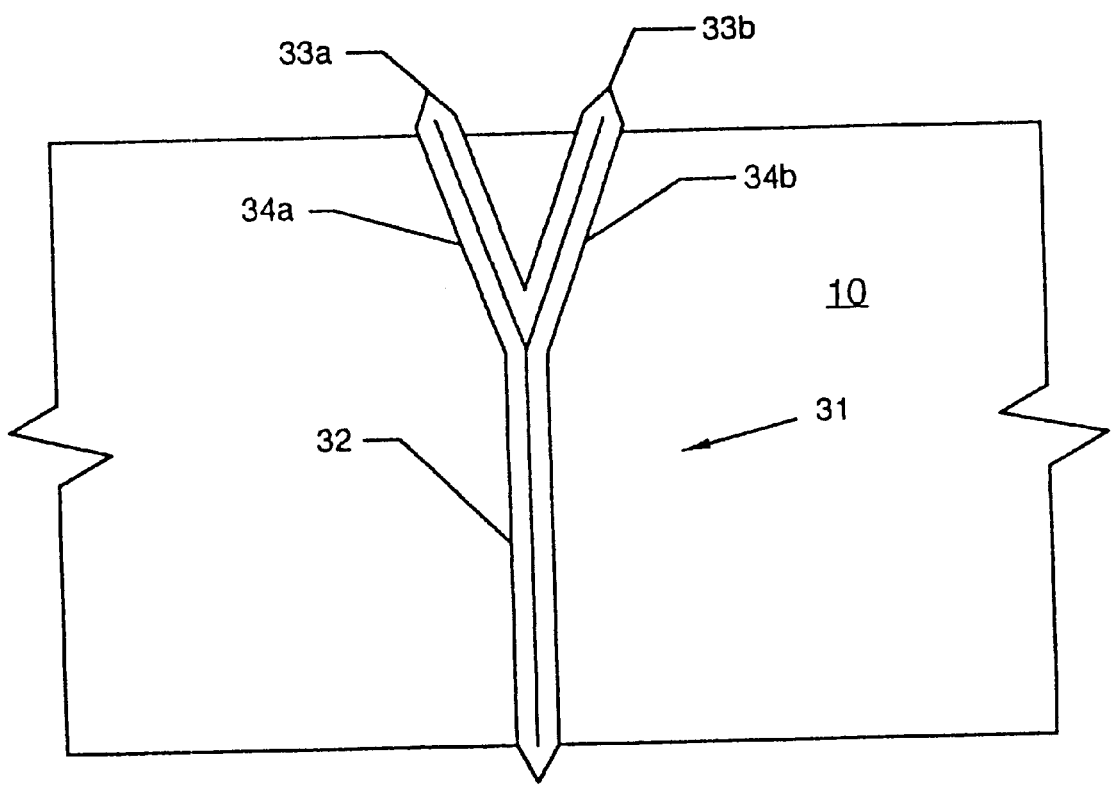
FIG. 7 is a partial sectional view of the dendritic metal particles and adhesive material taken along the line 3—3 of FIG. 3A showing the system after selective etching of the sacrificial metal substrate.

FIG. 7 shows the adhesive plastic film 10 after removal from temporary backing member 24 and selective etching of sacrificial metal substrate 21 to remove the pads.

Figure 8:
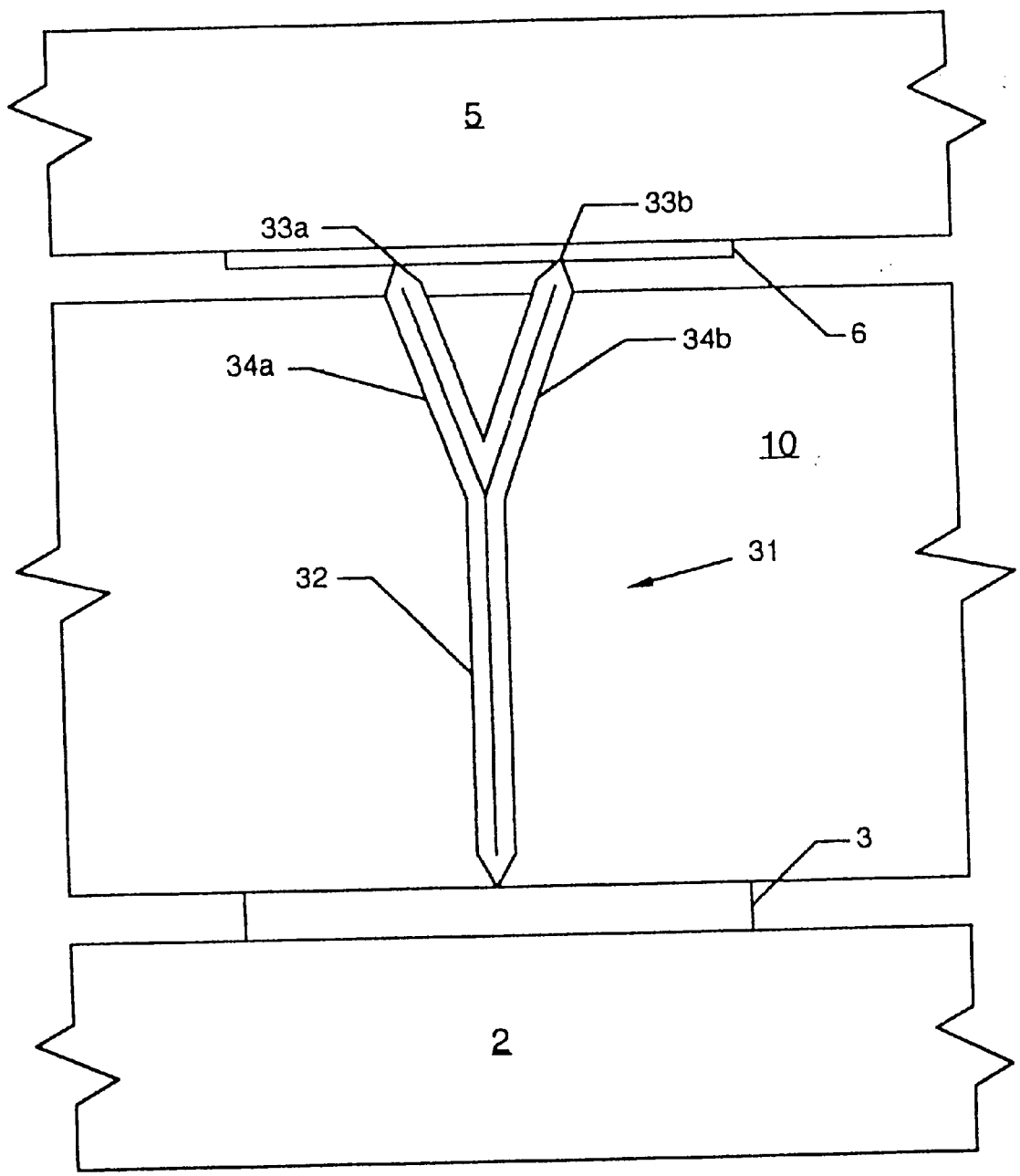
FIG. 8 is a partial sectional view of the dendritic metal particles and adhesive material taken along the line 3—3 of FIG. 3A showing the system after the electronic modules are in place.

FIG. 8 shows the adhesive plastic film 10 in position between a circuit board 2 having a conductive pad 3 and electronic circuit module 5 having a conductive pad 6. Typically, the pad 3 on circuit board 2 will project slightly above the upper surface of the board, while the pad 6 on electronic module 5 is more likely to form a level surface in conjunction with the lower surface of the module. While this might create interconnection problems with other systems, the upper, sharper, dendritic points are positioned to abut the pads 6 of module 5 and the lower, sharp dendritic points formed when the sacrificial metal substrate is etched away are used to connect to the raised pads 3 on the circuit board 2.

Figure 9:
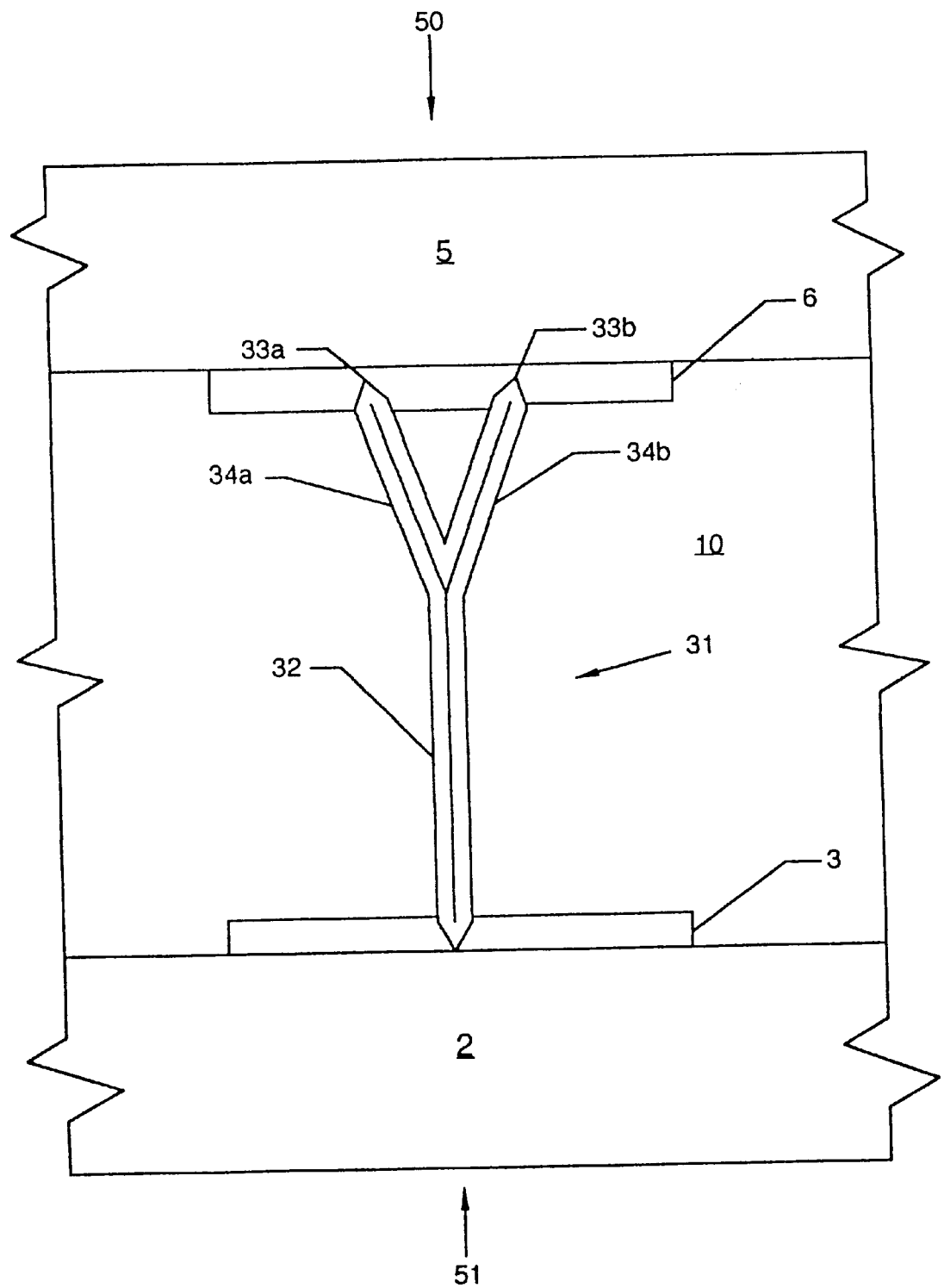
FIG. 9 is a microscopic partial sectional view of the dendritic metal particles and adhesive material taken along the line 3—3 of FIG. 3A showing the system with the electronic modules are in place after pressure has been applied to make the interconnection; and, FIG. 10 is a flow chart of the process used to practice the present invention.

The final step in the interconnection process is illustrated in FIG. 9. Appropriate pressure, indicated by the arrows 50 and 51, is applied across adhesive film 10, causing the adhesive film to compress and the dendritic ends 33a and 33b to penetrate the pad 6 on circuit module 5 and the lower portion of dendrites 31 to make contact with the pad 3 on circuit board 2. The pressure is maintained by using plastic shrink film or mechanical clamp as shown in FIGS. 2A and 2B. Alternatively, pressure may be maintained by the shrinkage which results from curing the adhesive film.

MODE OF OPERATION

FIG. 10 illustrates the method of the invention. The first step is the generation of the photoresist pattern of conductive pads on a nickel sacrificial substrate supported by a temporary backing member. The pattern corresponds to the pads on a circuit board and the electronic circuit modules to be connected thereto. The photoresist is exposed to light through a mask and developed to open up holes representing the pads to which connection is to be made.

After the pad holes are opened up, the substrate is immersed in a palladium salt solution and palladium dendrites are grown from the nickel pads until the dendrite ends pass beyond the photoresist, or reach such other suitable dimension as may be desired.

The photoresist is then stripped and a film of plastic adhesive material is applied to the surface, potting the dendrites, but leaving their ends exposed or just slightly below the film surface.

The plastic adhesive material is then removed from the sacrificial nickel backing and the temporary backing member, providing a thin film having areas, corresponding to the pads to be interconnected, in which palladium dendrites extend through the film.

The thin plastic adhesive film is then positioned on the circuit board with the dendrite containing areas aligned over the conductive metal pads on the circuit board. The circuit modules are then aligned over the adhesive plastic film, placing the conductive pads in alignment with the corresponding dendrite containing areas.

Pressure is then applied to the modules and the circuit board, causing the dendrite ends to make electrical contact with the conductive pads on the module and the circuit board and establishing the electrical connection between the pads.

The pressure is maintained by some suitable means such as plastic shrink wrap or mechanical clamping arrangement.

It will be appreciated that certain refinements may be desirable, or even necessary, in some instances. For example, the thermal expansion coefficient of the adhesive film may be matched to that of the printed circuit board or the circuit modules by the addition of suitable dielectric fillers such as silica or alumina. Similarly, the thermal conductivity of the film can be improved by the use of suitable fillers such as aluminum nitride, boron nitride, and granite.

Various modifications can be made to the present invention without departing from the apparent scope hereof.

We claim:

1. A device for interconnecting electronic modules to a wiring carrying substrate, comprising;

a. a flexible adhesive dielectric film having an upper surface to abut said module and a lower surface to abut said substrate and having a surface to surface thickness in the range of 1 to 2 mils;

b. said film having areas carrying dendritic metal particles oriented perpendicularly to the surfaces of said film; and wherein, c. said areas correspond to conductive pads on said modules.

2. A device according to claim 1, wherein said dendritic metal particles are palladium.

3. A device according to claim 2, wherein said dendritic particles are grown on a nickel substrate having a pattern corresponding to the modules and substrate pads which are to be connected.

4. A device according to claim 3, wherein said flexible adhesive dielectric film is selected from a group consisting of thermosets including epoxy; acrylic; silicone; cyanate ester; thermoplastics including polyimide, polyetherimide and polysulfone; and a mixture of thermoplastics and thermosets.

5. A device according to claim 3, wherein said adhesive film further contains a dielectric filler of high thermal conductivity.

6. A device according to claim 3, wherein said adhesive film further contains a dielectric filler having a coefficient of thermal expansion chosen to match the film to said electronic modules.

7. A device according to claim 3, wherein said adhesive film further contains a dielectric filler having a coefficient of thermal expansion chosen to match the film to said wiring carrying substrate.

8. A device according to claim 3, wherein said adhesive film further contains a dielectric filler having a coefficient of thermal expansion chosen to minimize the difference in the respective coefficients of thermal expansion between said film, said electronic modules and said substrate.

9. A device according to claim 3, wherein said areas containing dendritic particles have a surface to surface resistance less than 40 milliohms/square micrometer.

* * * * *